United States Patent Office 3,149,975

Patented Sept. 22, 1964

3,149,975

PHOTOPOLYMERIZABLE COMPOSITIONS AND ELEMENTS

Norman Thomas Notley, London, England, assignor to E. I. du Pont de Nemours and Company, Wilmington, Del., a corporation of Delaware No Drawing. Filed July 6, 1962, Ser. No. 208,091
12 Claims. (Cl. 96—115)

This invention relates to photopolymerizable compositions and elements embodying a layer of such compositions.

Many photopolymerizable compositions embodying initiators activatable by actinic light are known. More recently, monomeric polynuclear quinones have become of importance in the addition polymerization of acrylic and methacrylic acid esters of monohydric and polyhydric alcohols and related compounds because the photopolymerization takes place at a faster rate. In addition, the monomeric polynuclear quinones are thermally inactive at temperatures below 185° C. and according to Notley, U.S. Patent 2,951,758, filed Sept. 6, 1960, are very useful in making photopolymerizable compositions and elements for the preparation of printing plates.

While monomeric polynuclear quinones are good photoinitiators, their usefulness is sometimes limited. For example, anthraquinone has only a limited solubility in certain monomeric compounds. In making a photopolymerizable plate using such a monomer, an excess of anthraquinone crystallizes after a few hours, giving a plate defect known as "white specks." The amount of anthraquinone in such systems must, therefore, be kept below the solubility maximum. This, in turn, may affect the photo-speed of the polymerizable system which, up to a certain point, is proportional to the initiator concentration.

An object of this invention is to provide new and improved addition photopolymerizable compositions and elements embodying the same. Another object is to provide such compositions which contain novel polymeric initiators. A related object is to provide new photopolymerizable elements having a layer of such compositions. Still further objects will be apparent from the following description of the invention.

The photopolymerizable compositions of this invention comprise at least one addition polymerizable ethylenically unsaturated compound containing at least one terminal ethylenic group, having a boiling point above 100° C., and a molecular weight less than 1500, and are characterized by the presence of initiating amounts of a polymeric polynuclear quinone having a plurality of recurring polymer units to which there are joined through a linkage selected from the group consisting of amide, ester, ether and urethane linkages, a polynuclear quinone radical, and preferably an anthraquinone radical. The polymer may be a hydroxyl-containing polymer including a carbohydrate, e.g., a cellulose derivative. The compositions are preferably solid at 15° C. and may contain, in addition to the two main constituents, a polymeric binding material or viscosity modifying agent so that the compositions are solid at said temperatures. In addition, the compositions can contain thermal addition polymerization inhibitors, pigments, dyes and one or more chain transfer agents.

In general, the photopolymerizable compositions can be made by admixing the polymeric polynuclear quinone initiators with the ethylenically unsaturated addition polymerizable compound and the other desired constituents of the compositions. In a practical aspect of the invention, the compositions can be prepared by admixing 40 to 90 parts by weight (preferably 60 to 70 parts by weight) of (1) the polymeric polynuclear quinone and (2) 10 to 60 parts by weight (preferably 30 to 35 parts by weight) of the addition polymerizable ethylenically unsaturated compound. The compositions can be made by the same general methods disclosed in Plambeck U.S. Patent 2,791,504.

The photopolymerizable elements of this invention comprise a suitable support, e.g., a metal support or a hydrophobic polymer film support, which is coated with a layer of the composition. The supports may be rigid or flexible, that is, plates or sheets. Suitable supports include aluminum, steel, nylon, polyesters, e.g., polyethylene terephthalate. The photo-polymerizable layer can have a thickness of 3 to 250 mils or more in the case of elements used for the manufacture of printing plates. In the case of elements used for thermal transfer processes such as those described in assignee's Belgian Patents 593,834, 594,909 and 596,694, the photopolymerizable layer in general will have a thickness below 1 mil, e.g., from about 0.01 mil and lesser thickness, to about 1 mil in thickness. The layer will be on a thin hydrophobic film base, e.g., 1-mil polyethylene terephthalate.

Various sublayers or anchor layers can be interposed between the surface of the support and the photopolymerizable layer.

Suitable addition polymerizable ethylenically unsaturated compounds which can be used in the photopolymerizable compositions and elements include unsaturated esters of alcohols, preferably polyols, and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri- and tetramethacrylate, pentaerythritol tetraacrylate, pentaerythritol triacrylate, dipentaerythritol hexacrylate, tripentaerythritol octaacryldipentaerythritol hexacrylate, sorbital hexacrylte, inositol hexacrylate and the corresponding methacrylates, 1,3-propanediol diacrylate, 1,5-pentanediol dimethacrylate, the bis-acrylates and methacrylates of polyethylene glycols of molecular weight 200–1500, and the like; unsaturated amides, particularly those of the alpha-methylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis-(gamma-methacrylamidopropoxy)ethane, beta-methacrylamidoethyl methacrylate, N-beta-hydroxy-ethyl-beta-(methacrylamido)ethyl acrylate and N,N-bis(beta-methacrylyloxyethyl)acrylamide; vinyl esters such as divinyl succinate, divinyladipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can be used. The amount of monomer added varies with the particular thermoplastic polymer used.

The ethylenic unsaturation can be present as an extralinear substituent attached to a thermoplastic linear polymer, such as polyvinyl acetate/acrylate, cellulose acetate/acrylate, cellulose acetate/methacrylate, N-acrylyloxymethylpolyamide, N-methacrylyloxymethylpolyamide, allyloxymethylpolyamide, etc., in which case the monomer and polymer functions are combined in a single material.

The photopolymerizable compositions can contain immiscible polymeric or non-polymeric, organic or inorganic fillers or reinforcing agents which form essentially transparent compositions, e.g., the organophilic silicas, the bentonites, silica, powdered glass, and the like, having a particle size less than 0.4 mil in their maximum dimension, and in amounts varying with the desired properties of the insolubilizable layer. In like manner, dyes and pigments, which do not appreciably absorb light of the wavelength being used for exposure, can be incorporated in the insolubilizable layers, e.g., Fuchsine (CI 42,510), Calcocid Green S (CI 44,090), Solvent Yellow 34 (CI 4,100B), etc. Suitable pigments include $TiO_2$, colloidal carbon, graphite, ceramics, clays, phosphor particles, and metal powders, e.g., aluminum, magnetic iron, copper, etc.

The polymeric polynuclear quinones used in accordance with the invention are described and claimed in my related application, Ser. No. 208,090, filed July 6, 1962, entitled Polymeric Compounds and Their Preparation. As disclosed in said application, the new polymeric polynuclear quinones can be prepared by reacting a linear cellulosic polymer with a suitable derivative of a polynuclear quinone so that the quinone is bound to the polymer molecule by means of a carbon-oxygen or carbon-nitrogen linkage. Thus, it is possible to first make the cellulose ester and then combine it with the polynuclear quinone, or, alternatively, first make a suitable quinone derivative which is then reacted with a hydroxyl group of the cellulose or the cellulose ester to make the corresponding high molecular weight quinone compound.

In preferred photopolymerizable compositions, the polymeric polynuclear quinones are cellulose partial ethers and esters having linked thereto through an ester linkage a polynuclear quinone. These novel polymeric polynuclear quinone compounds can be made, in accordance with the invention, by reacting a polynuclear quinone containing an acid halide group, e.g., a carboxylic acid or sulfonic acid halide group with a cellulose partial ether or ester, i.e., one containing at least one free and esterifiable hydroxy group per glucose unit. Among the useful cellulose derivative reactants are cellulose esters of fatty acids of 2 to 4 carbon atoms, including cellulose butyrate, cellulose acetate propionate, cellulose acetate butyrate; cellulose alkyl and aryl ethers containing 1 to 7 carbon atoms in the lateral group, e.g., methyl cellulose, ethyl cellulose and benzyl cellulose.

The polynuclear quinone reactants containing a carboxylic acid chloride or sulfonic acid chloride group have two intracyclic carbonyl groups in a conjugated ring, there being at least one aromatic carbocyclic ring fused to the ring containing the carbonyl groups.

Suitable polynuclear quinone reactants containing acid halide groups include anthraquinone-1-carboxylic acid chloride, anthraquinone-2-carboxylic acid chloride, anthraquinone-2-sulfonic acid chloride, 1-nitroanthraquinone-4-sulfonic acid chloride, 1,4-dichloroanthraquinone-2-sulfonic acid chloride and 1-nitroanthraquinone-8-sulfonic acid chloride. The acid chlorides can be made from the corresponding free acids.

In another aspect of the invention the photopolymerizable compositions contain polymeric polynuclear quinones having the quinone nucleus linked to a cellulose derivative through an amide linkage. These polymeric compounds can be made by an acylation (imide forming) reaction of a polynuclear quinone containing an amino group (—$NH_2$) and a cellulose ester of a dicarboxylic acid or a cellulose ether of a hydroxycarboxylic acid containing a free —COOH group. Among the useful aminopolynuclear quinone reactants are 1-aminoanthraquinone and 2-aminoanthraquinone.

Suitable cellulose esters or ethers containing free carboxylic acid groups include cellulose acetate hydrogen succinate, maleate, glutarate and phthalate and carboxymethylcellulose. These cellulose esters and ethers may be mixed derivatives and may have some original hydroxyl groups esterified with acetate, propionate or butyrate groups or etherified and contain methoxy, ethoxy or benzyloxy groups.

The invention will be further illustrated, but is not intended to be limited, by the following examples:

*Example I*

A photopolymerizable composition was prepared by mixing on a rubber mill at 120° C. for 15 minutes a mixture of 33 g. of triethylene glycol diacrylate and 67 g. of the polyamide of 2-aminoanthraquinone with cellulose acetate hydrogen succinate that is described in Example I of applicant's related application Ser. No. 208,090, entitled Polymeric Compounds and Their Preparation, referred to above. The photopolymerizable composition was formed into a sheet having a thickness of 20 mils, placed on an aluminum sheet support coated with a layer of adhesive according to assignee's U.S. patent application, Burg, Ser. No. 750,868, filed July 25, 1958, U.S. Patent 3,036,913, May 29, 1962, and the element formed was placed in a hydraulic press, the platens of which had been preheated to 150° C., and pressed for 3 minutes at 200 p.s.i. Test step exposures were made by exposing the photopolymerizable composition to actinic radiation from an 1800-watt high pressure mercury arc light through a process negative having isolated dots as well as half-tone patterns. The photopolymer plate segments were exposed to 1.75 watts of actinic radiation per square inch for 2 to 8 seconds in 1 second increments. The unexposed material was washed out with a 0.04 N aqueous solution of sodium hydroxide. Twenty-mil dots were present in the segments exposed for 2 seconds or more and the halftone pattern could be seen in the segments exposed for 4 seconds or more.

A control element was prepared in the manner described above except that the photopolymerizable composition consisted of cellulose acetate hydrogen succinate and triethylene glycol diacrylate. Upon exposure to 1.75 watts of actinic radiation per square inch for more than 8 seconds and subsequent washout, neither the isolated dots nor the halftone features of the process negative were present.

*Example II*

A solution was made, consisting of:

| | | |
|---|---|---|
| Acetone | ml | 90.0 |
| Cellulose acetate succinate (see Example I) | g | 20.0 |
| Triethylene glycol diacrylate | g | 10.0 |
| p-Methoxyphenol | g | 0.04 |
| Photoinitiator of Example IV of the application referred to in Example I hereof (namely cellulose acetate/2-anthraquinone sulfonate) in 2 ml. of ethyl Cellosolve | g | 0.12 |

The resulting clear solution was cast on a glass plate provided with a paper dam to prevent the solution from flowing off. After drying in the dark overnight, a solid layer of approximately 0.020 inch thickness was obtained. This element was exposed for 8 seconds to 1.75 watts of actinic radiation per square inch, as described in Example I. After a washout with 0.04 N sodium hydroxide solution, a well defined relief image and obtained.

*Example III*

A mixture of 300 g. of finely pulverized cellulose acetate having a degree of acetyl substitution of 1.9, 208 g. of triethylene glycol diacrylate containing 0.1% of p-methoxyphenol and 0.2% of the cellulose acetate-anthraquinone sulfonate of Example II, and 127 g. of succinic anhydride were reacted as described in Smith U.S. Patent 3,012,952, issued Dec. 12, 1961, using 30 g. of diethylcyclohexylamine esterification catalyst. The resulting composition was formed into a sheet and applied to an aluminum support, as described in Example I. The resulting element was exposed for 8 seconds through a process negative to 1.75 watts of actinic radiation per square inch. After washout with 0.04 N sodium hydroxide solution, a well defined relief printing plate was obtained that gives good impressions, if used on a flatbed printing press.

*Example IV*

A tin-plated steel sheet support, 11 mils thick, which had been coated with a thin layer of a lacquer composed of a mixture of vinyl acetate/vinyl chloride copolymer and a phenol/formaldehyde resin, was coated with a 3-mil thick (dry thickness) layer of an adhesive solution prepared as described in Example I of assignee's Burg U.S. Ser. No. 750,868, filed July 25, 1958 (U.S. Patent 3,036,913, May 29, 1962). To the adhesive-coated base support was then laminated a 20-mil thick layer of a photopolymerizable composition prepared from a mixture of 67 g. of the amide formed by the reaction of 200 g. of cellulose acetate succinate and 0.15 g. of 2-aminoanthraquinone prepared as described in Example I, 33 g. of triethylene glycol diacrylate and 0.7 g. of p-methoxyphenol, as a polymerization inhibitor, which had been milled on the rubber mill at 150° C. for 30 minutes and formed into a sheet. A second photopolymerizable composition prepared by the same procedure but comprising 61 g. of the amide prepared from 200 g. of cellulose acetate succinate and 0.05 g. of 2-amino anthraquinone prepared according to Example I, 6.25 g. of polyvinylpyridine, 33 g. of triethylene glycol diacrylate and 0.07 g. of p-methoxyphenol was formed into a sheet of 20-mil thickness and laminated to the lower photopolymerizable layer. The element was placed in a hydraulic press, the platens of which had been preheated to 150° C., and pressed for 3 minutes at 200 p.s.i. The element was placed in a vacuum frame and the photopolymerizable surface was brought into contact with a mixed line and halftone negative. The vacuum frame containing the element and negative was placed beneath a 1,800-watt high-pressure mercury arc and exposed to 1.75 watts of actinic radiation per square inch for 40 seconds. After exposure, the negative was stripped from the element, and the unexposed material was removed by spray washing with a 0.04 N solution of sodium hydroxide for 5 minutes. A sharp relief image, firmly bonded to the base support and corresponding to the clear areas of the negative, having deep shadow wells and excellent half-tone dots, was obtained. Because of the composite layer structure and the higher initiator concentration in the lower layer, the resulting printing characters were of conical shape, having a strong, broad base and a sharply defined printing surface. The printing element showed excellent image quality and long press life when used for printing in a flat press, the images being neither plugged nor undercut.

*Example V*

A thermoplastic, photopolymerizable composition was prepared from the following solution:

| | G. |
|---|---|
| Cellulose acetate butyrate | 2.0 |
| Triethylene glycol diacrylate | 1.2 |
| Pentaerythritol triacrylate | 3.6 |
| Cellulose acetate-phenanthrenequinone derivative | 1.2 |
| p-Methoxyphenol | 0.0048 |
| Crystal Violet (CI Basic Violet 3) | 0.020 |
| Acetone to make 40.0 g. | |

The cellulose acetate butyrate contained about 20.5% acetyl groups and about 26% butyryl groups and had a viscosity of 9 to 13.5 poises as determined by ASTM method D-871-54T in a solution described as Formula A in this method. The cellulose acetate-phenanthrenequinone derivative was prepared according to Example V of my related U.S. patent application Ser. No. 208,090, filed July 6, 1962, and entitled "Polymeric Compounds and Process of Preparing Same."

This solution was coated on a 1-mil thick sheet of polyethylene terephthalate film and dried in the dark. The dry coating has a thickness of 0.3 mil. A second sheet of 1-mil thick polyethylene terephthalate film was then rolled onto the coating as a cover sheet, taking care to exclude air bubbles. The laminate cover was contacted with a sheet of opaque white paper on which a message was printed in black ink and exposed reflectographically for 2 seconds with a 20-watt blue fluorescent lamp. The cover sheet was then stripped off, the exposed photopolymer layer brought in contact with a sheet of white paper and the sandwich passed between two rollers, out of which was heated to 115° C. In the exposed areas, corresponding to the white areas of the original, polymerization had occurred, whereby the softening point of the layer was raised above the transfer temperature. In the underexposed areas, corresponding tothe black area of the original, essentially no polymerization had occurred, thus the softening point in these areas was below the transfer temperature. Upon separating the two sheets as they emerged from the rollers, a copy in violet color of the original was obtained on the white paper.

A control experiment, using the same coating ingredients, but replacing the cellulose acetate-phenanthrenequinone derivative by an equal amount of cellulose acetate, did not yield a copy of the original under the conditions mentioned above.

The photopolymerizable compositions of this invention are not only useful in the photopolymerizable layer or layers of photopolymerizable elements for the preparation of printing reliefs and for thermal image transfer processes, but are useful for other purposes. They are useful for affixing phosphors to surfaces to provide color television screens and to form indicia on instrument panels; for the preparation of silk screen stencils, printed circuits and matrices for the preparation of raised writing for the blind, e.g., according tothe Braille system. In addition, they can be used as photo-setting adhesives, as in the preparation of safety glass, for the production of photocrosslinked plastics and for the application of raised designs to surfaces, e.g., ornamental or name plates and identification badges.

The photopolymerizable composition of the instant invention comprising the high molecular weight derivatives of the polynuclear quinones and ethylenically unsaturated compounds are advantageous because the said compositions are essentially thermally stable at temperatures below 185 C. and polymerize quickly when exposed to actinic light. The photopolymerizable compositions are especially advantageous because the photoinitiator component does not migrate from areas of higher concentration into areas of lower concentration, e.g., in multiple photopolymerizable layer printing elements. The photoinitiator can be present in larger quantities without the formation of white specks. The relief images formed are of excellent quality and the mechanical hardness and resistance of the image to the washout solution during development and to ink during printing is also excellent.

I claim:

1. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a polymeric polynuclear quinone having a plurality of recurring polymer units forming a carbohydrate nucleus to which there are joined through a linkage selected from the group consisting of amide, ester, ether and urethane linkages a polynuclear quinone radical, said radical being pendant to the polymeric chain of said carbohydrate nucleus.

2. A composition according to claim 1 wherein said unsaturated compound has a boiling point above 100° C. and a molecular weight less than 1500 and said carbohydrate nucleus is a cellulose nucleus.

3. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a polymeric polynuclear quinone having a plurality of recurring polymer units forming a cellulose nucleus to which there are joined through an amide linkage a polynuclear quinone radical, said radical being pendant to the polymeric chain of said cellulose nucleus.

4. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a polymeric polynuclear quinone having a plurality of recurring polymer units forming a cellulose nucleus to which there are joined through a carboxylic acid ester linkage a polynuclear quinone radical, said radical being pendant to the polymeric chain of said cellulose nucleus.

5. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a polymeric polynuclear quinone having a plurality of recurring polymer units forming a cellulose nucleus to which there are joined through a sulfonic acid ester linkage a polynuclear quinone radical, said radical being pendant to the polymeric chain of said cellulose nucleus.

6. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a cellulose fatty acid/anthraquinone carboxylic acid ester wherein the fatty acid radical contains 2 to 4 carbon atoms.

7. A composition according to claim 6 wherein said ester is cellulose acetate succinate/anthraquinone carboxylate.

8. A photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a cellulose fatty acid/anthraquinone sulfonic acid mixed ester wherein the fatty acid radical contains 2 to 4 carbon atoms.

9. A composition according to claim 8 wherein said ester is a cellulose acetate/2-anthraquinone sulfonate.

10. A photopolymerizable element bearing a layer of a photopolymerizable composition comprising an admixture of preformed constituents including (1) at least one addition polymerizable ethylenically unsaturated compound containing at least one terminal ethylenic group capable of forming a high polymer by photoinitiated addition polymerization, and (2) initiating amounts of a polymeric polynuclear quinone having a plurality of recurring polymer units forming a carbohydrate nucleus to which there are joined through a linkage selected from the group consisting of amide, ester, ether and urethane linkages a polynuclear quinone radical, said radical being pendant to the polymeric chain of said carbohydrate nucleus.

11. A photopolymerizable element according to claim 10 wherein said unsaturated compound has a boiling point above 100° C. and a molecular weight less than 1500 and said carbohydrate nucleus is cellulose.

12. A photopolymerizable element according to claim 10 wherein there are at least two layers of said photopolymerizable composition but the element contains different amounts of initiator in the respective layers.

References Cited in the file of this patent

UNITED STATES PATENTS

| | | |
|---|---|---|
| 2,934,544 | Cripps | Apr. 26, 1960 |
| 2,951,758 | Notley | Sept. 6, 1960 |
| 2,964,401 | Plambeck | Dec. 13, 1960 |
| 3,012,952 | Smith | Dec. 12, 1961 |
| 3,024,180 | McGraw | Mar. 6, 1962 |
| 3,946,127 | Barney et al. | July 24, 1962 |